United States Patent
Wilson et al.

(10) Patent No.: US 10,431,421 B2
(45) Date of Patent: Oct. 1, 2019

(54) APPARATUS AND TECHNIQUES FOR BEAM MAPPING IN ION BEAM SYSTEM

(71) Applicant: Varian Semiconductor Equipment Associates, Inc., Gloucester, MA (US)

(72) Inventors: Eric D. Wilson, Gloucester, MA (US); George M. Gammel, Marblehead, MA (US); Sruthi Chennadi, Gloucester, MA (US); Daniel Tieger, Gloucester, MA (US); Shane Conley, Gloucester, MA (US)

(73) Assignee: VARIAN SEMICONDUCTOR EQUIPMENT ASSOCIATES, INC, Gloucester, MA (US)

( * ) Notice: Subject to any disclaimer, the term of this patent is extended or adjusted under 35 U.S.C. 154(b) by 0 days.

(21) Appl. No.: 15/803,344

(22) Filed: Nov. 3, 2017

(65) Prior Publication Data
US 2019/0139740 A1    May 9, 2019

(51) Int. Cl.
*H01J 37/317* (2006.01)
*H01J 37/244* (2006.01)

(52) U.S. Cl.
CPC ........ *H01J 37/3171* (2013.01); *H01J 37/244* (2013.01); *H01J 2237/24405* (2013.01); *H01J 2237/24535* (2013.01); *H01J 2237/24542* (2013.01); *H01J 2237/30477* (2013.01); *H01J 2237/31703* (2013.01)

(58) Field of Classification Search
None
See application file for complete search history.

(56) References Cited

U.S. PATENT DOCUMENTS

| | | | | |
|---|---|---|---|---|
| 4,922,106 A | * | 5/1990 | Berrian | H01J 37/147 250/398 |
| 4,980,562 A | * | 12/1990 | Berrian | H01J 37/147 250/397 |
| 6,566,661 B1 | | 5/2003 | Mitchell | |
| 7,176,470 B1 | * | 2/2007 | Evans | H01J 37/304 250/398 |

(Continued)

FOREIGN PATENT DOCUMENTS

JP    02-091146 U    7/1990

OTHER PUBLICATIONS

International Search Report and Written Opinion dated Jan. 22, 2019 for PCT/US2018/057068 filed Oct. 23, 2018.

*Primary Examiner* — Michael J Logie

(57) ABSTRACT

An apparatus for monitoring of an ion beam. The apparatus may include a processor; and a memory unit coupled to the processor, including a display routine, where the display routine operative on the processor to manage monitoring of the ion beam. The display routine may include a measurement processor to receive a plurality of spot beam profiles of the ion beam, the spot beam profiles collected during a fast scan of the ion beam and a slow mechanical scan of a detector, conducted simultaneously with the fast scan. The fast scan may comprise a plurality of scan cycles having a frequency of 10 Hz or greater along a fast scan direction, and the slow mechanical scan being performed in a direction parallel to the fast scan direction. The measurement processor may also send a display signal to display at least one set of information, derived from the plurality of spot beam profiles.

8 Claims, 9 Drawing Sheets

(56) References Cited

U.S. PATENT DOCUMENTS

| | | | | |
|---|---|---|---|---|
| 2006/0076510 | A1* | 4/2006 | Chang | H01J 37/3171 250/492.21 |
| 2006/0097195 | A1* | 5/2006 | Angel | G01T 1/29 250/492.21 |
| 2006/0266957 | A1* | 11/2006 | Chang | H01J 37/304 250/492.21 |
| 2006/0284114 | A1* | 12/2006 | Olson | H01J 37/304 250/492.21 |
| 2008/0078953 | A1* | 4/2008 | Gupta | H01J 37/302 250/492.21 |
| 2009/0242808 | A1* | 10/2009 | Evans | C23C 14/48 118/697 |
| 2012/0248324 | A1* | 10/2012 | Eisner | H01J 37/302 250/396 ML |
| 2014/0212595 | A1* | 7/2014 | Bai | C23C 14/48 427/523 |
| 2014/0326179 | A1* | 11/2014 | Todorov | C23C 14/48 118/697 |
| 2015/0364297 | A1 | 12/2015 | Tsukihara et al. | |
| 2018/0068828 | A1* | 3/2018 | Halling | H01J 37/304 |

\* cited by examiner

APPARATUS AND TECHNIQUES FOR BEAM MAPPING IN ION BEAM SYSTEM

FIELD

The present embodiments relate to ion beam systems and methods, and more particularly, to apparatus and methods to facilitate control of ion beams.

BACKGROUND

Ion implanters may employ detector to measure and tune the uniformity of an ion beam as the ion beam is directed to a substrate at an end station. Often a detector in the form of a current monitor, such as a Faraday cup is placed in a beamline in or near the end station, where a substrate is processed. In ion implanters employing a scanned spot beam, the ion beam may be measured in more than one manner. In one mode of measurement, which mode may be deemed a stationary slow spot beam profile, a beam scanner is turned off so an undeflected ion beam passes through the beam scanner and projects onto a substrate plane (wafer plane), often at a position of 0 mm, meaning a center of the wafer. A detector, such as a Faraday detector is scanned across the wafer plane to measure the stationary ion beam, generating measurements of the spot beam size, beam shape, and so forth, for a scan taking 10 seconds, for example, for a 300 mm wafer. In another mode, which mode may be deemed a scanned linear profile, the net result of the ion beam density across the wafer plane is measured as the ion beam is scanned back and forth at a constant velocity, such as 1000 Hz, where the velocity may match the scanning velocity of a scanned spot beam to be employed during wafer processing. While the ion beam is being scanned at this high velocity, a detector, such as a Faraday detector, may be scanned at 30 mm/second across the wafer plane to measure the stationary spot beam shape, size etc. In an additional mode, which mode may be deemed a stationary fast spot profile, a detector is located at a stationary position, such as 0 mm (wafer center) while the ion beam is rapidly scanned across the detector for several cycles, such as 5-16, creating an average spot beam profile in approximately 10 msec. In cases where the spot beam and ion implanter operate in an ideal manner, there would be no change in a spot beam across the wafer plane and these three approaches can be used by the operator visually diagnose and correct for up-stream ion beam scanning and focusing issues. Notably, if the spot beam shape or position changes significantly across the wafer plane as the spot beam is being scanned, these three approaches do not provide the operator with sufficient visual tools to properly diagnose and correct for upstream scanning and focusing issues.

Notably, as beam energies become lower and lower, the spot beam changes more and more across the wafer plane, which changes cause non-uniformities in the ion beam density, where the non-uniformities are hard to correct. This inability for the operator to visually discern and correct non-uniformities in scanned spot beams ultimately can reduce the yield and degrade the performance of the semiconductor devices.

It is with respect to these and other considerations the present embodiments are provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus for monitoring of an ion beam, may include a processor; and a memory unit coupled to the processor, including a display routine, where the display routine operative on the processor to manage monitoring of the ion beam. The display routine may include a measurement processor to receive a plurality of spot beam profiles of the ion beam, the spot beam profiles collected during a fast scan of the ion beam and a slow mechanical scan of a detector, conducted simultaneously with the fast scan. The fast scan may comprise a plurality of scan cycles having a frequency of 10 Hz or greater along a fast scan direction, and the slow mechanical scan being performed in a direction parallel to the fast scan direction. The measurement processor may also send a display signal to display at least one set of information, derived from the plurality of spot beam profiles.

In a further embodiment, an apparatus for control of an ion beam, may include a beam scanner to perform a fast scan of the ion beam over a plurality of scan cycles having a frequency of 10 Hz or greater along a fast scan direction, and a detector, disposed to intercept the ion beam, and to perform a slow scan simultaneous to the fast scan. The slow scan may involve moving the detector from a first position to a second position along a scan path parallel to the fast scan direction, wherein a plurality of spot beam profiles are received by the detector during the slow scan. The apparatus may also include a user interface, coupled to the detector; and a controller, coupled to the scanner, the user interface, and the detector. The controller may include a processor; and a memory unit coupled to the processor, including a display routine, the display routine operative on the processor to send a display signal to display on the user interface, at least one set of information, derived from the plurality of spot beam profiles.

In another embodiment, a method of controlling an ion beam, may include scanning the ion beam over a plurality of scan cycles having a frequency of 10 Hz or greater along a fast scan direction. The method may further include mechanically scanning a detector through the ion beam in a slow scan during the plurality of scan cycles of the ion beam, from a first position to a second position along a scan path parallel to the fast scan direction, wherein the detector generates a plurality of spot beam profiles. A spot beam profile may correspond to a beam profile of the ion beam at a given location of the detector along the scan path. The method may further include displaying on a user interface at least one set of information, derived from the plurality of spot beam profiles.

DETAILED DESCRIPTION

Figure 1A:
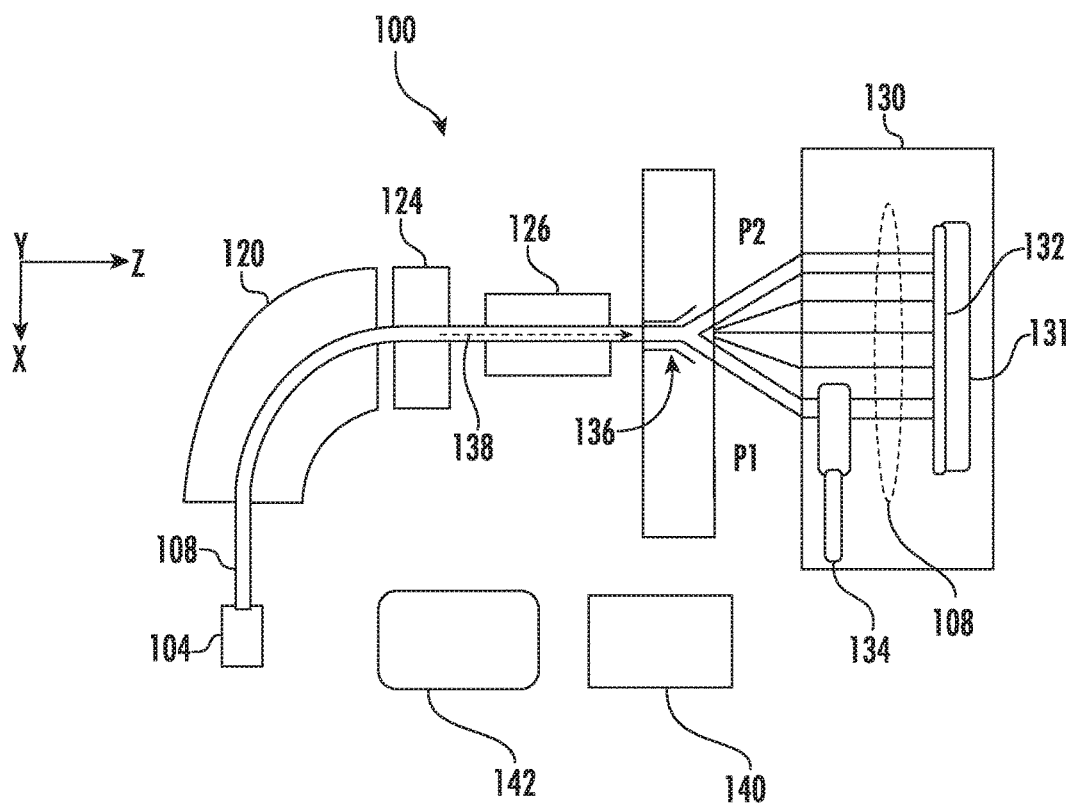
FIG. 1A depicts a schematic top view of an ion implantation system for generating and controlling a scanned spot ion beam in accordance with embodiments of the present disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein relate to systems, apparatus and techniques providing improved monitoring and control of ion beams generated in an ion implanter, in particular, scanned spot beams. Various embodiments are related to measuring scanned spot beams and presenting ion beam information collected from a scanned spot beam in a novel manner. As detailed below, in one mode of operation, consistent with the present embodiments, a so-called moving fast spot profile mode (or Beam Ray Map mode), an ion implanter may perform a series of operations. Firstly, a Stationary Fast Spot Profile may be performed with the spot beam located at 0 mm to establish a reference spot beam shape. Secondly, the spot beam may be rapidly scanned while a detector, such as a Faraday detector, is slowly scanned across the wafer plane, such as for a duration of 3 minutes, while traversing a distance of ~300 mm. A series of spot beam profiles are taken at given intervals where each of these "Moving Fast Spot Profiles" are compared to the reference fast spot profile performed at 0 mm. Consistent with various embodiments of the disclosure, this comparison may be performed in a Beam Ray Map mode by creating a "map" of how key parameters of the spot beam (size, shape, center offset relative to the detector, symmetry, beam density, and so forth) change over the wafer plane. According to some embodiments, a Beam Ray Map user interface may be provided to highlight these changes in the ion beam as the ion beam traverses the wafer plane. Also, the information generated in Beam Ray Map mode may be used by software to better correct for these ion beam changes for improved device yield and performance.

Referring now to FIG. 1A depicts a schematic top view of an ion implantation system for generating and controlling a scanned spot ion beam in accordance with embodiments of the present disclosure. The ion implantation system, referred to as ion implanter 100, represents a process chamber containing, among other components, an ion source 104 for producing an ion beam 108, an ion implanter, and a series of beam-line components. The ion source 104 may comprise a chamber for receiving a flow of gas and generating ions. The ion source 104 may also comprise a power source and an extraction electrode assembly (not shown) disposed near the chamber. The beam-line components may include, for example, an analyzer magnet 120, a mass resolving slit (MRS) 124, a steering/focusing component 126, and end station 130, including substrate holder 131.

The ion implanter 100 further includes a beam scanner 136 positioned along a beamline 138 between the MRS 124 and the end station 130. The beam scanner 136 may be arranged to receive the ion beam 108 as a spot beam and to scan the ion beam 108 along a fast scan direction, such as parallel to the X-Axis in the Cartesian coordinate system shown. Notably, the substrate 132 may be scanned along the Y-axis, so a given ion treatment to an entirety of the substrate 132 as the ion beam 108 is simultaneously scanned back and forth along the X-axis. At a given instance, for example, when stationary and not being scanned, a spot beam may exhibit a Gaussian beam density cross section where beam current intensity is measured along the Y axis as a function of the X axis position along the substrate plane, as known in the art. By scanning the ion beam 108, a scanned ion beam is generated across the substrate 132, having an elongated cross-section, where the effective width of the scanned ion beam 108 is adequate to traverse the entire width of substrate holder 131. The ion implanter 100 may have further components, such as a collimator as known in the art (not shown for clarity), to direct ions of the ion beam 108, after scanning, along a series of mutually parallel trajectories to the substrate 132, as suggested in FIG. 1A. In various embodiments, the ion beam may be scanned at a frequency of several Hz, 10 Hz, 100 Hz, up to several thousand Hz, or greater. For example, the beam scanner 136 may scan the ion beam 108 using magnetic or electrostatic scan elements, as known in the art.

By scanning the ion beam 108 rapidly over a fast scan direction, such as back and forth over along the X-axis, the ion beam 108, configured as a spot beam, may deliver a targeted ion dose of uniform density across a substrate 132. For example, the ion beam 108, configured as a spot beam, exhibits a beam profile, meaning a variation in ion current density (y(y)) as a function of position (x), which beam profile may be measured in one dimension, such as along the fast scan direction (parallel to the X-axis). Knowledge of the beam profile of ion beam 108 may be used to precisely scan the ion beam 108 across the substrate 132 to generate a uniform ion current density across the substrate 132. Notably, to accomplish this uniformity, a measurement of the ion beam 108 size, density and expected position may initially be performed.

The ion implanter 100 may further include a detector 134, disposed to intercept the ion beam 108. The detector 134 may be a known type of current detector, such as a Faraday probe, or other current detector. The detector 134 may be configured to perform a scan along a direction parallel to the fast scan direction (X axis in FIG. 1). In one implementation, the ion implanter may be operated in "Stationary Slow Spot Profile" mode, as detailed above, wherein a stationary ion beam is profiled by scanning the detector 134 across the substrate 132 for a duration of 5 seconds, 10 seconds, 20 seconds, or other suitable time.

Generally, in different modes of operation, the detector 134 may be configured to scan along a straight line across the wafer plane from a near position, P1, to a far position, P2, over a duration ranging from several seconds to many minutes. The distance between P1 and P2 may be adequate to traverse an entire width of a substrate 132, such as 200 mm, 300 mm, or 400 mm. The embodiments are not limited in this context. The detector 134 may include a sensor extending several millimeters to several centimeters along the fast scan direction, wehrein a portion of the ion beam 108 is intercepted at a given instance.

The ion implanter 100 may further include a controller 140, coupled to the beam scanner 136 and to the detector 134, to coordinate operation of the beam scanner 136 and detector 134.

As further shown in FIG. 1A, the ion implanter 100 may include a user interface 142, also coupled to the detector 134. The user interface 142, also referred to as a BEAM RAY MAPPER, may be embodied as a display, and may include user selection devices, including touch screens, displayed menus, buttons, knobs, and other devices as known in the art. According to various embodiments, the user interface 142 may be coupled to other components of the ion implanter 100, in order to display at least one set of information derived from scans performed by the detector 134, as well as from beam scanner 136. As detailed below, the ion implanter 100 is advantageously arranged to generate novel beam measurements and a novel visual display of information related to beam measurements, to facilitate better control of the ion beam 108.

Figure 1B:
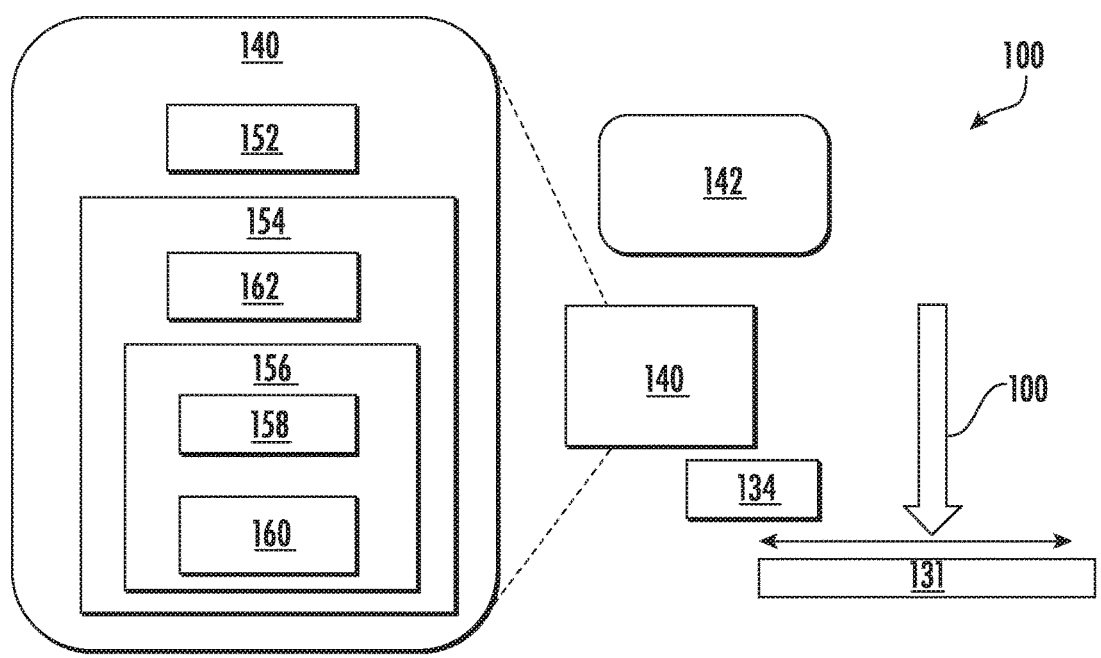
FIG. 1B depicts a block diagram of a controller of the ion implantation system of FIG. 1A.

As further shown in FIG. 1B, the controller 140 may include a processor 152, such as a known type of microprocessor, dedicated processor chip, general purpose processor chip, or similar device. The controller 140 may further include a memory or memory unit 154, coupled to the processor 152, where the memory unit 154 contains a display routine 156. The display routine 156 may be operative on the processor 152 to manage monitoring of the ion beam as described below. The memory unit 154 may comprise an article of manufacture. In one embodiment, the memory unit 154 may comprise any non-transitory computer readable medium or machine readable medium, such as an optical, magnetic or semiconductor storage. The storage medium may store various types of computer executable instructions to implement one or more of logic flows described herein. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In particular embodiments, the display routine 156 may include a measurement processor 158 and control processor 160. As detailed below, the measurement processor 158 may receive a plurality of spot beam profiles of the ion beam 108, where the spot beam profiles are collected during a scan of a profile detector, i.e., a slow mechanical scan of the detector 134. The memory unit 154 may further include a spot beam storage 162, for storing detected spot beam profiles, to be used, for example, for analysis and also for improving spot beam uniformity. The measurement processor 158 may further send a display signal to display at least one set of information, derived from the plurality of spot beam profiles. For example, the display signal may be sent to retrieve or to forward spot beam profiles to the user interface 142. The measurement processor 158 may further perform calculations to determine and display various parameters derived from the spot beam profiles. In some instances, the user interface 142 may provide selection devices, including visual menus or similar structures, responsive to user input, where the measurement processor 158 may retrieve, format, and send information from the spot beam profiles to the user interface 142, in response to user input.

Figure 2:
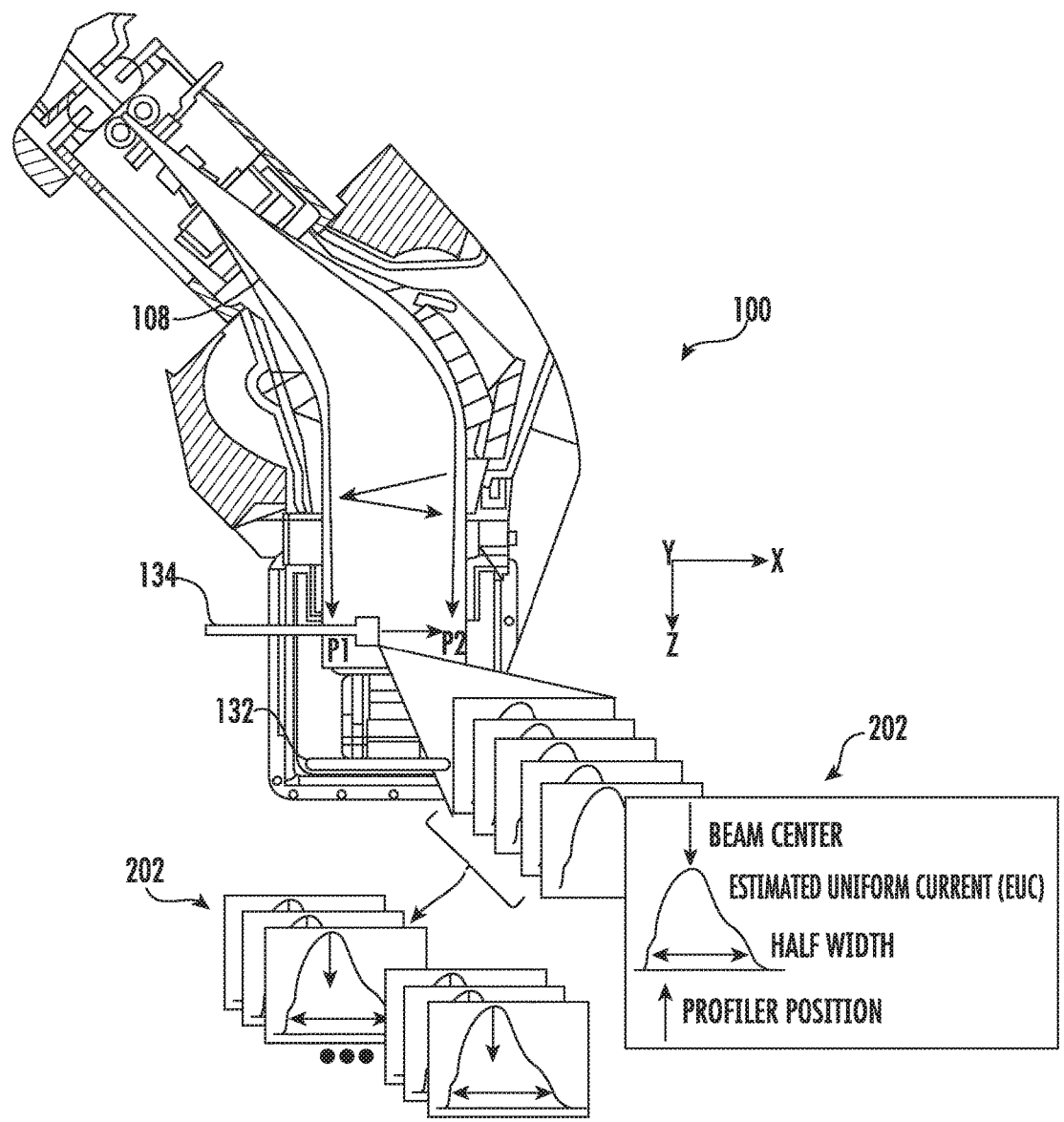
FIG. 2 depicts operation of an embodiment of an ion implantation system according to embodiments of the disclosure.

Turning now to FIG. 2 there is shown one scenario for operation of the ion implanter 100, according to embodiments of the disclosure. The figure depicts an overview of the Beam Ray Mapper mode of operation, described above. In this scenario, the ion beam 108 is electrostatically scanned across the detector 134, such as a current detector Faraday cup, while the detector 134 is mechanically scanned across the substrate plane, parallel to the X-axis. This simultaneous action of performing a Fast scan of the ion beam and a Slow profile scan of the detector 134 enables the ion implanter 100 to determine if and by how much an ideal reference spot beam spot beam (ion beam 108) changes as the ion beam 108 is being scanned across the wafer plane.

In some embodiments, the detector 134 may perform a slow scan over a distance of 340 mm from P1 to P2. This distance may cover the region of a scanned spot beam intercepted by the substrate 132. The slow scan may be a mechanical scan where the detector 134 is mechanically scanned by a motor or other drive mechanism to slowly move in a linear manner. In one example, the detector 134 may travel at a velocity of approximately 100 mm/minute and may traverse the distance from P1 to P2 in 3.5 min. During the slow scan (mechanical profile) of the detector 134, the ion beam 108, having the shape of a spot beam, may perform a Fast profile operation over the moving detector where the ion beam 108 is scanned back and forth along a direction generally parallel to the X-axis at 10 Hz, 100 Hz, 1000 Hz, or other suitable frequency. According to some embodiments, during a group of select scans, such as five successive Fast profile scans of the ion beam 108, the controller 140 may generate an average spot beam profile of the ion beam 108, representing an average spot beam profile of the five scans of the ion beam 108 recorded by the detector 134 at the given position of the detector 134 between P1 and P2. In one example, a single fast profile scan of the ion beam 108 may last for 10 msec, where five successive profiles consume 50 msec. Accordingly, if the detector 134 is traveling at a constant velocity of 1 mm/sec, the five successive scans used to calculate an average spot beam profile may correspond to a distance traveled of approximately 0.05 mm. To facilitate rapid and real-time analysis and display of beam information, the average spot beam profile of these five successive profiles may be stored and uploaded to controller 140 for analysis. Thus, at a 1000 Hz scan rate, up to 20 average spot beam profiles, each averaging together 5 fast scans may be recorded in the time the detector 134 travels 1 mm. In some embodiments, the average spot beam profile may be sampled intermittently or continuously during the slow scan of the detector 134. For example, to upload an average profile of five successive scans may consume 0.5 seconds, so new average spot beam profiles may be conveniently recorded and processed on the order of one per second. Because an average spot beam profile may be determined while the ion beam 108 traverses a distance of 0.05 mm, a given average spot beam profile represents a quasi-stationary spot beam profile at any given position along the Y-axis, within a resolution of ~0.05 mm. In one specific embodiment, 420 average spot beam profiles may be uploaded during a 3 min slow scan of detector 134 over a distance of 300 mm, generating a resolution of 11 average spot beam profiles per millimeter. As such, the assemblage of average spot beam profiles 202 provides a detailed multidimensional map of the ion beam 108 as a function of position across the substrate 132. In the above example, the average spot beam profiles 202 may be conveniently collected in 3 min, while improvements in data handling may allow collection rates to be improved by a factor of five, for example. In still further embodiments, spot beam average spot beam profiles may be calculated from an average of as few as one spot beam profile, 3 spot beam profiles to as many as 20 spot beam profiles. The embodiments are not limited in this context. In various embodiments, the number of spot beam profiles to be collected to generate an average spot beam profile 202 may be adjustable at the user interface 142. For higher noise spot beams, the number of spot beam profiles used to generate an average spot beam profile 202 may be increased, while for lower noise spot beams, the number of spot beam profiles may be decreased to generate an average spot beam profile 202. The collection and presentation of information from such average spot beam profiles may aid in control of the ion beam 108, and may also aid an operator in identifying and resolving upstream ion beam steering or focusing issues in the ion implanter 100.

For example, scanned spot beams may deviate in shape depending upon the exact position of the spot beam on a substrate. This deviation in shape may change the size of the spot beam, the center position of the spot beam, the half-width of the spot beam, and the peak position of the spot beam, leading to errors in control of the dose of ions directed to a substrate as the spot beam is scanned. In particular, the actual position of the (center of the) spot beam may deviate from the ideal expected position. According to embodiments of the disclosure, based upon spot beam profiles collected as described above with respect to FIG. 2, the position of the center of a spot beam, with respect to the position of detector 134 may be compared to the center of the reference spot beam when located at a central position between P1 and P2. For example, P1 may be represented as −170 mm, while P2 is represented as +170 mm. The center of the spot beam at any given instance with respect to detector 134 may be compared to the center of the reference spot beam at 0 mm. By way of background, a beam profile at any given instance may be generated from a detector by recording the ion dose as a function of time, and mapping time to a position along the segment between P1 and P2. While the relative position of the detector 134 with respect to the beam center reference varies as the detector is slowly scanned, the ideal difference of the beam center at 0 mm with respect to the detector 134 at any given instance can be readily calculated and used as a reference. Thus, in an ideal circumstance, the difference between the position of the detector 134 and the center of the spot beam should appear to change in a manner where the center and beam shape symmetry of the spot beam dose not vary. Said differently, in the ideal circumstance, a scanned spot beam does not change shape and is located in the expected position as the spot beam is being scanned across the wafer plane. Notably, if the spot beam changes shape, or the actual position vs. and expected scan position varies, those anomalies will be highlighted by the collection and presentation of information of the ion implanter 100 when operating in BEAM RAY MAP mode.

Figure 3:
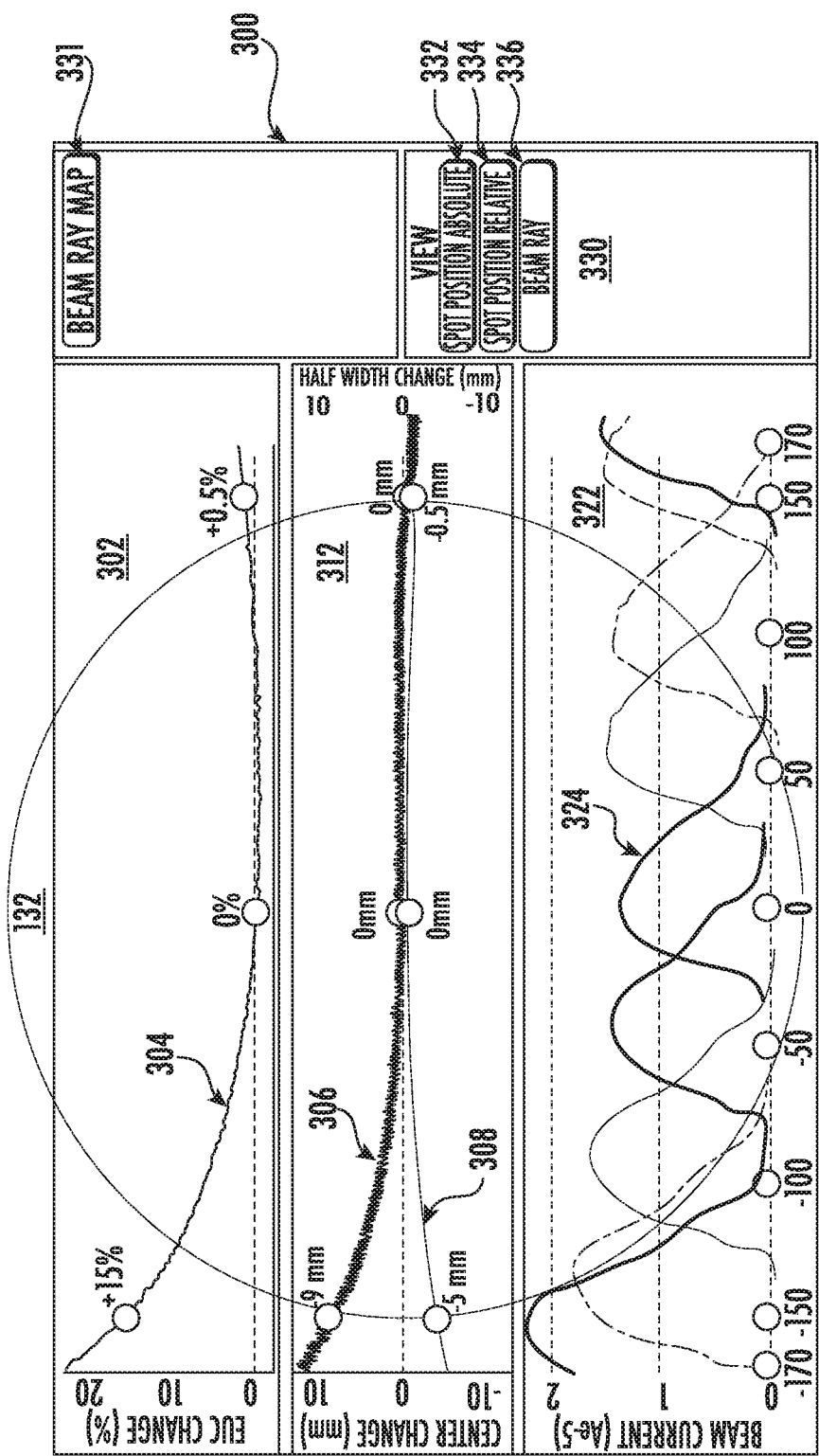
FIGS. 3-5 depict exemplary operation of a user interface under one scenario, according to embodiments of the disclosure.
Figure 4:
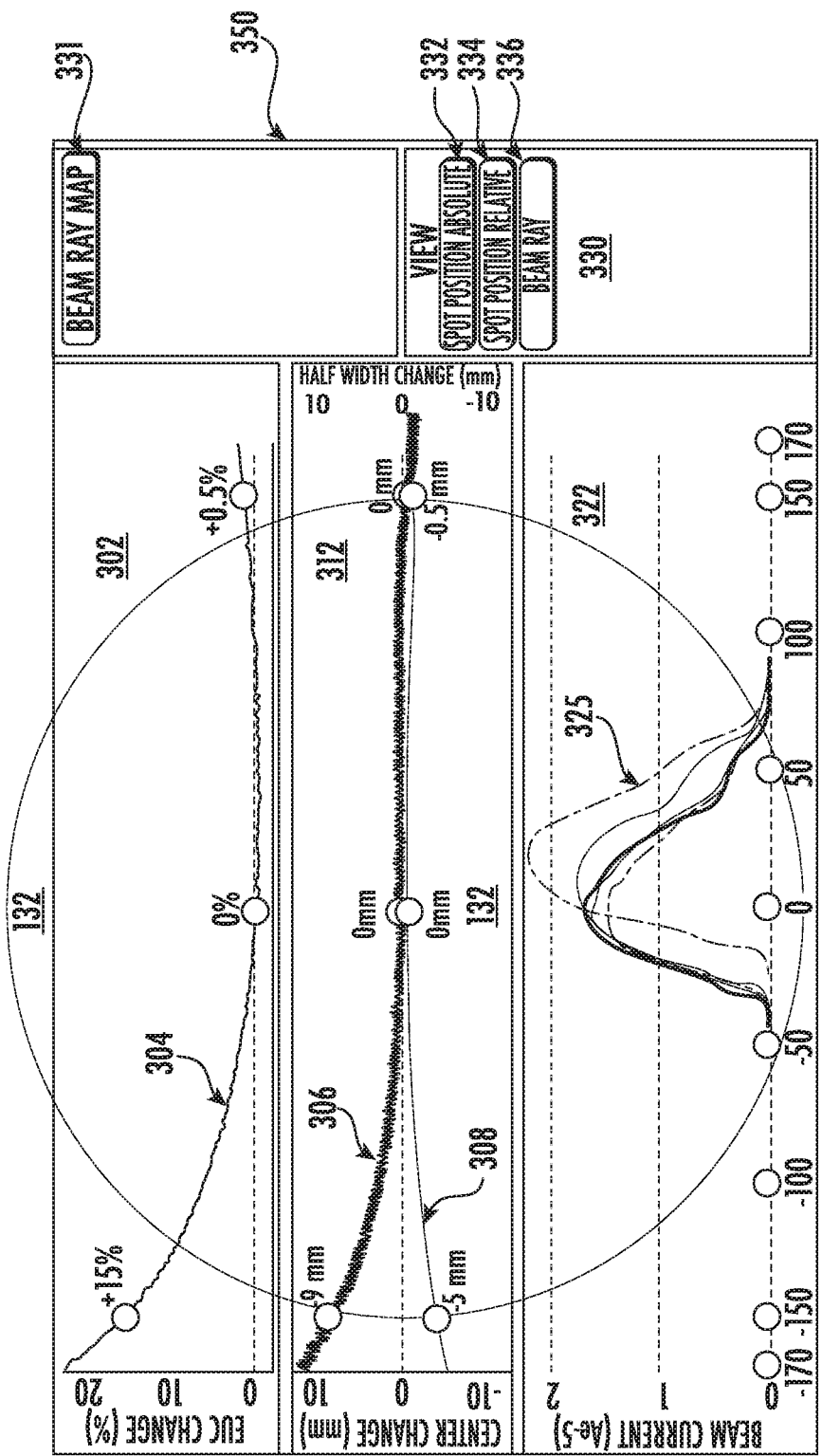
Figure 5:
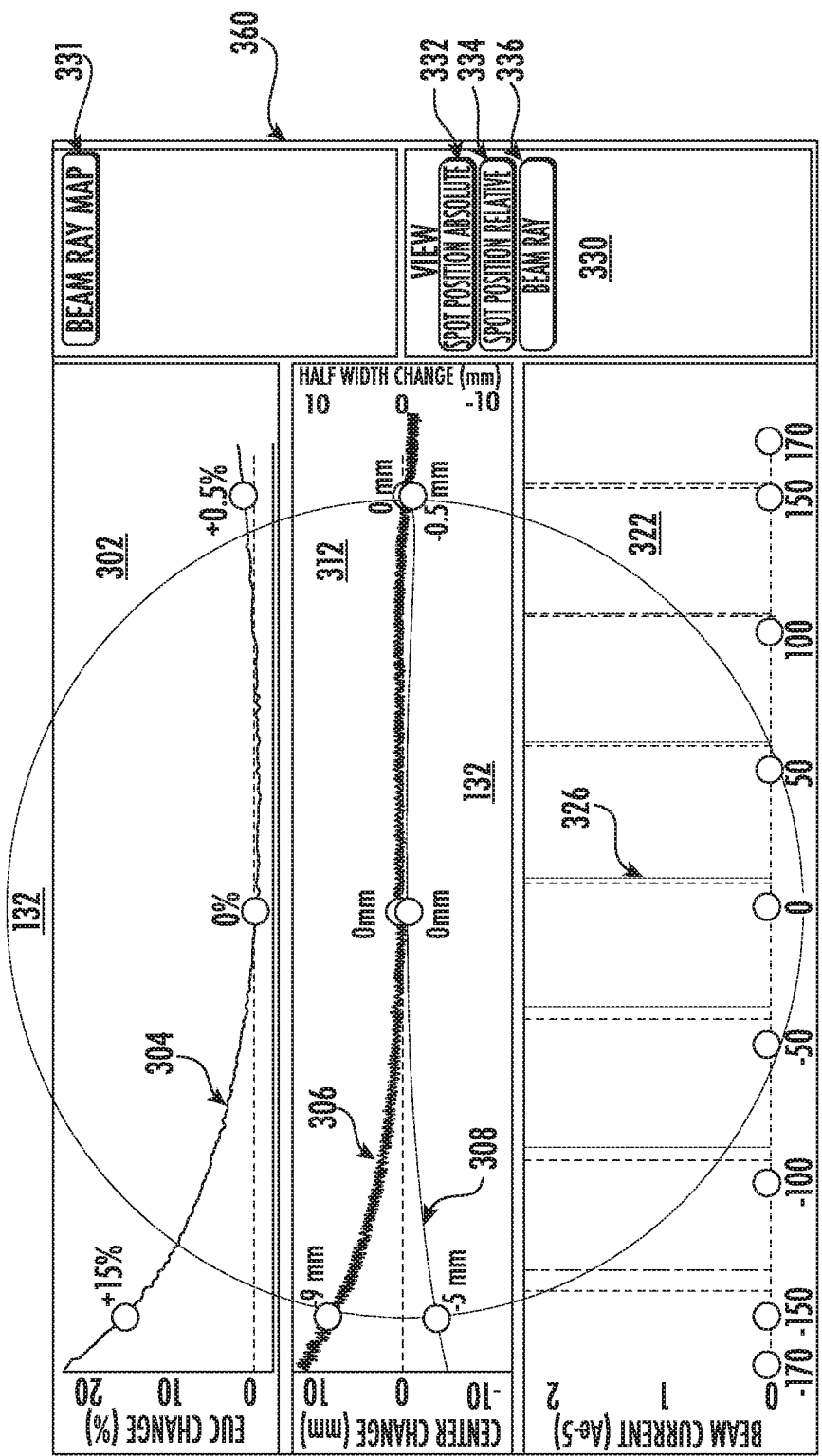

In FIGS. 3-5 to follow, exemplary operation of a user interface 142 is illustrated to diagnose and control beam non-idealities in a high energy scanned spot beam, processed in accordance with the embodiments discussed above. As an initial matter, in a reference mode of operation, a reference ion beam, such as a 100 kV argon beam, may be directed as a stationary beam and measured according to known procedures at a position corresponding to 0 mm, in a center of a wafer. In one example, three parameters may be obtained from the known measurement procedure: 1) an estimated uniform current (EUC); 2) spot beam center; and 3) beam half-width.

FIG. 3 presents a user interface arrangement 300 to show variation in spot beam position as a function of detector position in a non-ideal circumstance. In this case, a scanned 100 kV argon ion beam is directed to a substrate (wafer) in a manner causing a beam shift from targeted positions. In accordance with embodiments of the disclosure, the detector 134 may be slowly scanned while a spot ion beam is rapidly scanned back and forth as described above. The information presented in FIG. 3 may represent ion current data collected during a slow scan for the detector 134 of approximately 3.5 min duration, and may be instantly uploaded to a user interface, temporarily stored, or permanently stored for subsequent display.

In various embodiments, either automatically, or responsive to user input, information collected during such a slow scan may be calculated, manipulated, retrieved, formatted, or presented on a display, or any combination of these actions. In accordance with some embodiments, a user interface may include hardware such as buttons, dials, or soft selection mechanisms, such as menus on displays or soft keys. In accordance with some embodiments, the user interface arrangement 300 may include a menu 330 allowing the user to select various types of information for presentation, where the information is derived from spot beam profiles of a given slow scan of the detector 134. In some embodiments, the information may include position information, shape information related to a spot beam shape, and so forth. Examples of position information include received position information of a detector during a slow scan including a plurality of detector locations. Examples of shape information may include spot beam half-width, as well as a spot beam profile. The embodiments are not limited in this context. In the example of FIG. 3, the menu 330 may allow a user to retrieve and display of information in a plurality of fields, including field 302, field 312 and field 322.

In various embodiments, the menu 330 may cause an ion implanter to execute a scanning operation responsive to user input, or may retrieve and present information from a previously performed scan. For example, in some embodiments, the menu 330 may include selection devices, such as hardware buttons, or soft buttons for performing a specific set of actions. In one embodiment, the menu 330 may include a BEAM RAY MAP button 331, where, when pressed, an ion implanter is instructed to enter Beam Ray Map mode, including performing a slow scan of a detector and simultaneously a fast scan of a beam scanner, and for data to be retrieved and presented. In some implementations, the engagement of the BEAM RAY MAP button 331 may simply cause the uploading and analysis of data from an already performed, designated scan, where the designated scan was performed according to the Beam Ray Map mode, discussed above. In various embodiments, up to 420 separate average spot beam profiles may be collected in as little as 3 min, 1 min, or 20 seconds as a detector is scanned over a distance of 340 mm, for example. In one procedure, based upon a slow scan collecting a spot beam profile at least per 1 mm, a SPOT POSITION ABSOLUTE button 332 may be engaged to display a series of spot beam profiles as a function of different positions of the detector 134. This information is shown in field 322, where a series of spot beam profiles 324 are shown, with the middle spot beam profiles separated by 50 mm distance from one another. The number of profiles and spacing among spot beam profiles to be displayed may be adjustable in the menu 330 in some embodiments. For example, the operator may find, for a particular Beam Ray Map, a certain amount of profiles and their spacing is ideal to highlight a particular trend in spot beam position change across the wafer plane. As illustrated, the shape of the spot beam profiles varies from left to right.

In some procedures, the change in EUC of a spot beam may also be displayed, as exemplified by curve 304 in field 302. For instance, the EUC of the spot beam at ~1 mm increments of profile position of detector 134, may be compared to the EUC of the reference spot beam at 0 mm.

In one example, this information may be formatted and presented in the field 302, as shown, where the DIFFERENCE (in %) of the EUC is shown in curve 304. This EUC measurement upswing shows a noticeable increase in spot size between −170 mm and −50 mm.

In an additional procedure, at a ~1 mm increment, the center of the spot beam with respect to the detector 134 may be compared to the center of the reference spot beam at 0 mm. The difference in these two values may be visually displayed in a field 312, as shown by curve 306. As illustrated, the difference in the actual location vs the expected location of the spot beam is shifted by up to 10 mm on the left side, while being in general alignment on the right side. Accordingly, armed with such knowledge, an operator may make appropriate adjustments in beamline parameters to reduce or eliminate the horizontal shifting of the spot beam.

In an additional procedure, at 1 mm increments of the position of detector 134, the half-width of a spot beam may be compared to the reference half-width measured at 0 mm. In FIG. 3, the field 312 also includes a curve 308, plotting the half-width of a spot beam as a function of position, compared to the half-width measured at a position corresponding to 0 mm. This information shows the circumstance where on the left side of the substrate 132 the half-width of the spot beam narrows so at −150 mm (representing the left edge of a 300 mm wafer), the half-width is compressed by 5 mm. The different fields shown in the user interface arrangement 300 are merely exemplary, and may be generated automatically on a user interface 142, or may be generated according to user input, as noted.

FIG. 4. presents another an example of a user interface arrangement 350, illustrating how the same information as presented in FIG. 3 be displayed to better show how the spot beam shape changes across the wafer plane. By pressing a SPOT POSITION RELATIVE button, the spot beam waveforms, shown at 50 mm intervals in the "Absolute" view of FIG. 4, can be all superimposed on top of one another as a collection 325 at a given position, such as 0 mm. This view can help the operator by highlighting a trend in the size or shape of the spot beam as the spot beam is scanned across the wafer plane. In one implementation, the position of the spot beams are displayed relative to a position of a detector during a slow scan of the detector performed at the time of measurement.

Each waveform may be color coded to a given position, so an operator can readily determine the absolute position of the waveform. By superimposing the spot beam profiles 324 over one another at 0 mm, the operator can quickly determine subtle changes in the spot beam shape as the spot beam is scanned across the wafer plane. The user interface 142 accordingly allows an operator to quickly jump back and forth between the SPOT POSITION ABSOLUTE and SPOT POSITION RELATIVE views, as exemplified in the user interface arrangement 300 and user interface arrangement 350, respectively. For example, the operator can easily see where an abnormal spot shape with a certain color in the RELATIVE view is actually positioned in the ABSOLUTE view. Armed with this knowledge of spot beam size or position abnormalities at particular locations on the wafer plane, the operator can make adjustments to improve the upstream focusing or steering of the spot beam in a manner to remove these abnormalities as the spot beam is being scanned across the wafer plane FIG. 5 Illustrates another example of how the same information acquired for FIG. 4 may be displayed at a user interface arrangement 360, to highlight non-idealities in a spot beam. In one example, by pressing a BEAM RAY button 336, the display routine 156 may generate a format signal, wherein a series of beam ray map convergence/divergence lines 326 are displayed. These lines show the spot beam center position at a given increment, such as 50 mm increments along a slow scan path of the detector 134, compared to an ideal center position (dashed white line), as shown in field 322. Again, the shift in the position of the actual beam center (solid lines) provides a user with a clear visual representation of inboard shift of the spot beams on the left half of the wafer. The information provided in FIGS. 3-5 may be used by an operator to rapidly adjust control parameters for at least one component of an ion implanter to reduce these spot beam changes, which reduction can result in an improved overall scanned beam uniformity, for example.

Figure 6:
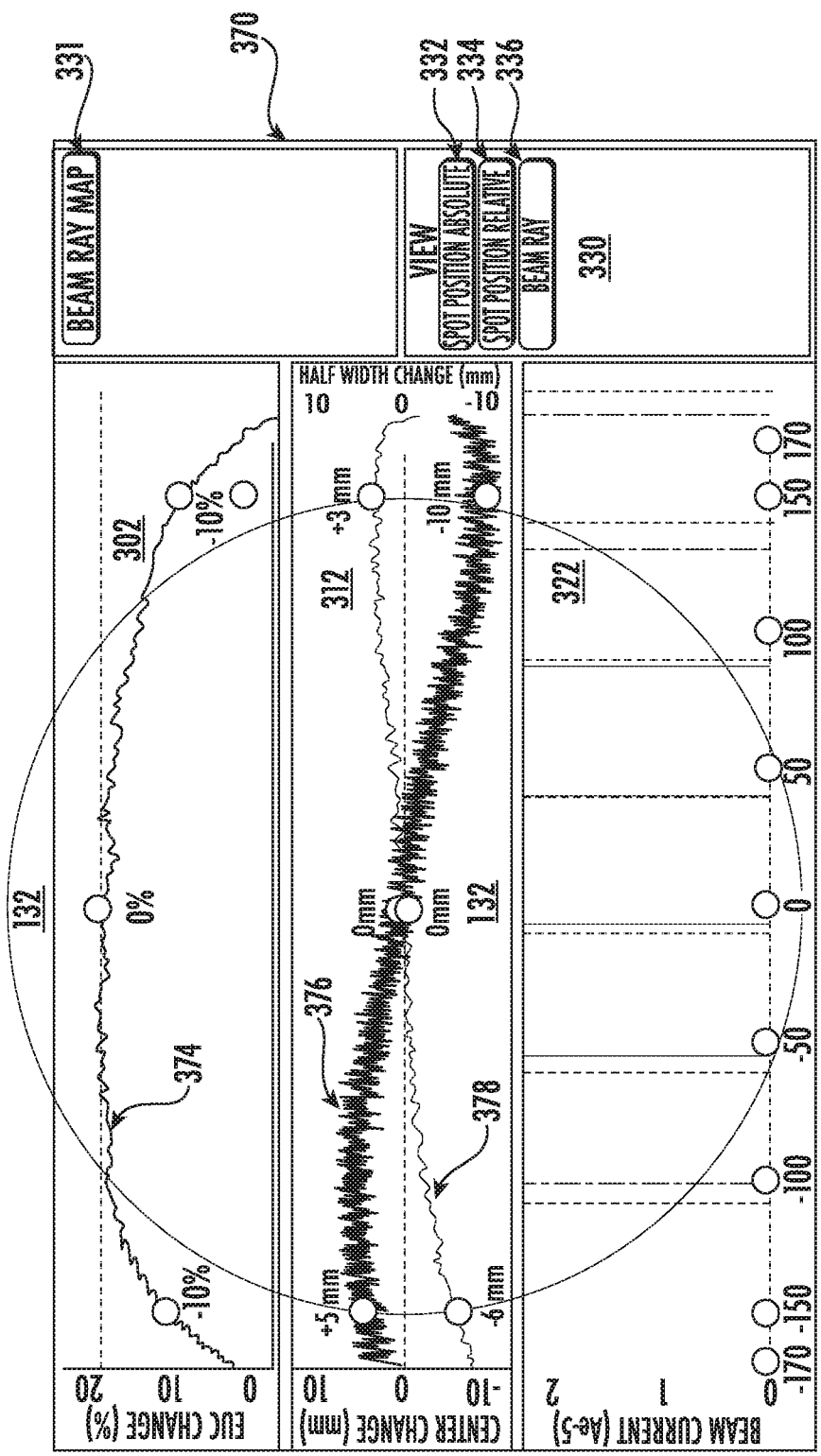
FIGS. 6-8 depict exemplary operation of a user interface under a different scenario, according to further embodiments of the disclosure.

In particular embodiments, spot beam profiles may be collected and analyzed to provide information regarding operation of a beam scanner of the spot beam. By way of background, in known beam scanners, a scalar calibration constant (SCC) may be applied to map the voltage applied to electrostatic electrodes of the beam scanner and the expected position of a spot beam along a wafer plane (see the direction between P1 and P2 in FIG. 1, representing a scan parallel to the wafer plane). In the case of low energy ion beams, accelerated to less than 20 kV, the accuracy of this SCC map is especially useful for generating low energy uniformity tune time and success rate. Known profiling techniques using a scanned spot beam over a stationary detector are not capable of generating information as to how a spot beam is mis-steered when the SCC is not correct. Likewise, a linear measurement of a known non-deflected spot beam waveform at 0 mm contains no information concerning an incorrect SCC. Notably, using Beam Ray Map visualizations in accordance with the embodiments of the disclosure, an incorrect SCC can show a downward or upward trend in the spot beam position difference (with respect to the reference at 0 mm) as the beam is scanned across the wafer plane Consistent with various embodiments of the disclosure, as discussed above, when a user engages a device, field, or button on user interface 142, such as a BEAM RAY button 336 (shown in FIGS. 3-5), generating an input signal, the user interface 142 may display various information related to the shape of the scanned spot beam. Turning now to FIG. 6, there is shown a user interface arrangement 370, where the information displayed is derived from a scanned 5 kV boron spot beam. The spot beam is scanned in a manner described above where a slow scan of the detector 134 is conducted while a spot beam is rapidly scanned back and forth during scanning of the detector. At least some of the information shown in user interface arrangement 370 is displayed responsive to a selection of the BEAM RAY button 336. In this example, the user interface includes field 302, field 312, and field 322, discussed above. Curve 374 illustrates an EUC difference curve, as detailed above. The curve 374 is generally symmetrical about the position of 0 mm, and does not show a large variation between −100 mm and +100 mm. The curve 374 does show how the spot beam size drops off to approximately −10% at +/−150 mm when compared to the reference spot beam size at 0 mm. Often, a uniformity tuning routine may be able to compensate for this lower beam density drop off on the sides of the wafer by slowing down the scanned beam speed according to the EUC drop. Notably, if the actual spot beam location is shifted from the expected location, these speed adjustments to compensate for the EUC drop will be in the wrong place on the wafer plane and the tuning routine may have difficulty achieving the desired scanned beam uniformity. The slope of curve 376 highlights a shift in expected vs. actual spot beam position between +/−100 mm. This shift is indicative of the SCC being too high.

A main feature standing out in this arrangement is the shape of curve 376 in field 312. The curve 376 represents a difference in beam centers between an actual spot beam center and ideal beam center, shown as a function of position during a slow scan of the detector 134. The curve 376 exhibits a significant negative slope of the beam center difference, between the spot beam center as measured by the detector 134 during a slow scan of the detector 134 and the spot beam center at 1 mm. This negative slope implies the beam rays of a spot beam located on the right side of the wafer are more "inboard" (towards 0 mm) than expected.

The field 312 also includes a curve 378, plotting the half-width of a scanned spot beam as a function of detector position. In this example, the half-width increases monotonically from the left side of the wafer (substrate 132) to the right side.

The user interface arrangement 370 also includes the field 322, illustrating the shift of the measured spot beam position during scanning of detector 134 from a targeted position, shown in the vertical dashed lines for a series of nominal positions across the substrate 132. In the example shown, a non-deflected beam ray has a beam center position of 40 mm. When a spot beam is scanned over a right edge of a wafer at +150 mm, the actual spot beam position is targeted to be at 190 mm (with the non-deflected beam center being offset by 40 mm. When the SCC applied to a scanner is in error, such as too high, the actual spot beam may be positioned at 180 mm, as shown in field 322. While this position is located off of a wafer, the mispositioning can affect on-wafer beam current uniformity because of the width of the spot beam. When the spot beam is scanned to the left edge of the wafer at −150 mm, the targeted spot beam position should be at 110 mm. Due to convergence, the actual spot beam position is shown to be at −105 mm.

The visual display of these discrepancies as a function of position along a wafer plane (between P1 and P2) is useful for an operator to assist in properly steering and focusing low energy ion beams. As noted, this misplacement of the spot beam may be caused by a 6% too-high SCC. This high value of SCC causes the beam rays to increasingly converge, the further the beam rays are deflected from the center of the wafer. Ultimately, this deviation may cause a uniformity tuning routine to fail or be abnormally high (which circumstance can affect device yield). Thus, timely collecting information capable of visually alerting a user to an SCC error may allow the beam scanner to be adjusted to reduce or eliminate the SCC error, before processing actual wafers to be implanted or otherwise treated by the spot beam.

Figure 7:
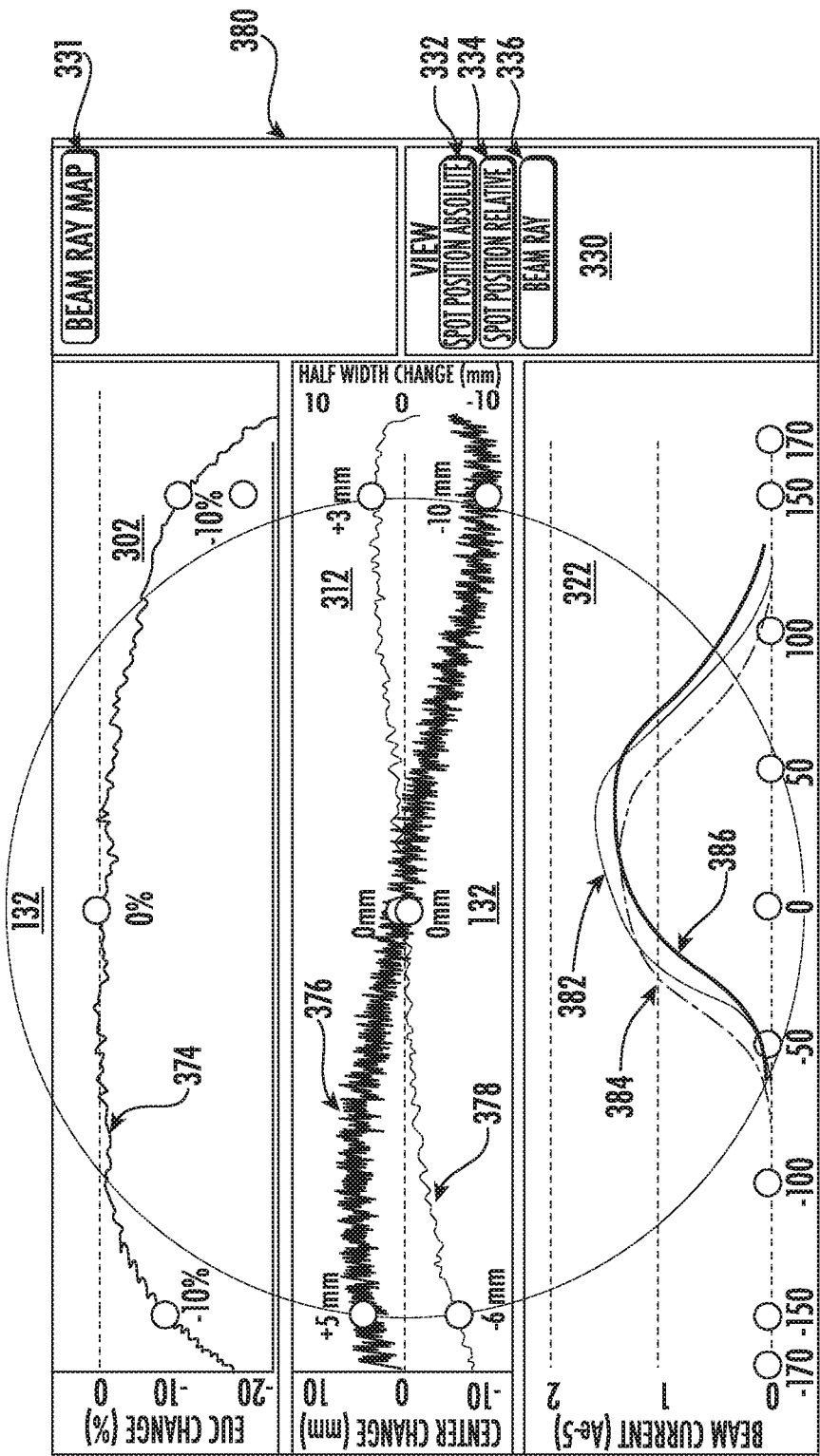

Consistent with additional embodiments, the user interface 142 may provide multiple different ways to display information related to the same series of spot beam profiles. FIG. 7 presents a user interface arrangement 380, invoked when a user engages a field or button, such as A SPOT POSITION RELATIVE button 334, discussed above. As shown, the field 322 is displayed, which field may be useful to further illustrate adverse effects of an SCC when the SCC is too high for a beam scanner. Continuing with the example of FIG. 6, when the SCC is 6% too high, the beam shape of spot beams sampled at different locations during a scan of the detector 134, may be shown in a manner where beam profiles collected at the different locations are superimposed upon one another. In FIG. 7, field 322, multiple spot beam profiles may be superimposed on an undeflected spot beam profile for comparison. The undeflected beam curve is shown as curve 382, while curve 384 represents the spot beam deflected by +150 mm, and curve 386 represents the spot beam deflected by −150 mm. The curve 384 shows the spot beam at +150 mm has a 10 mm inboard shift and a reduction in beam height of 10%, while the curve 386 shows the spot beam at −150 mm has a 5 mm inboard shift, with beam height also reduced by 10%.

As a practical matter, the user interface arrangement shown in FIGS. 6 and 7 may be presented to a user after a slow scan of the detector 134 is performed to collect the series of spot beam profiles. For example, when an operator first obtains a spot beam profile set, the curve 376 may be summoned firstly, to verify the slope of curve showing differences in beam center is flat over a target region, such as +/−100 mm with respect to wafer center. In cases where curve 376 is not flat, as shown, further information, such as curve 378 or the information shown in field 322 of FIG. 6 and FIG. 7 may be employed to guide correction in beamline components, such as a beam scanner.

Figure 8:
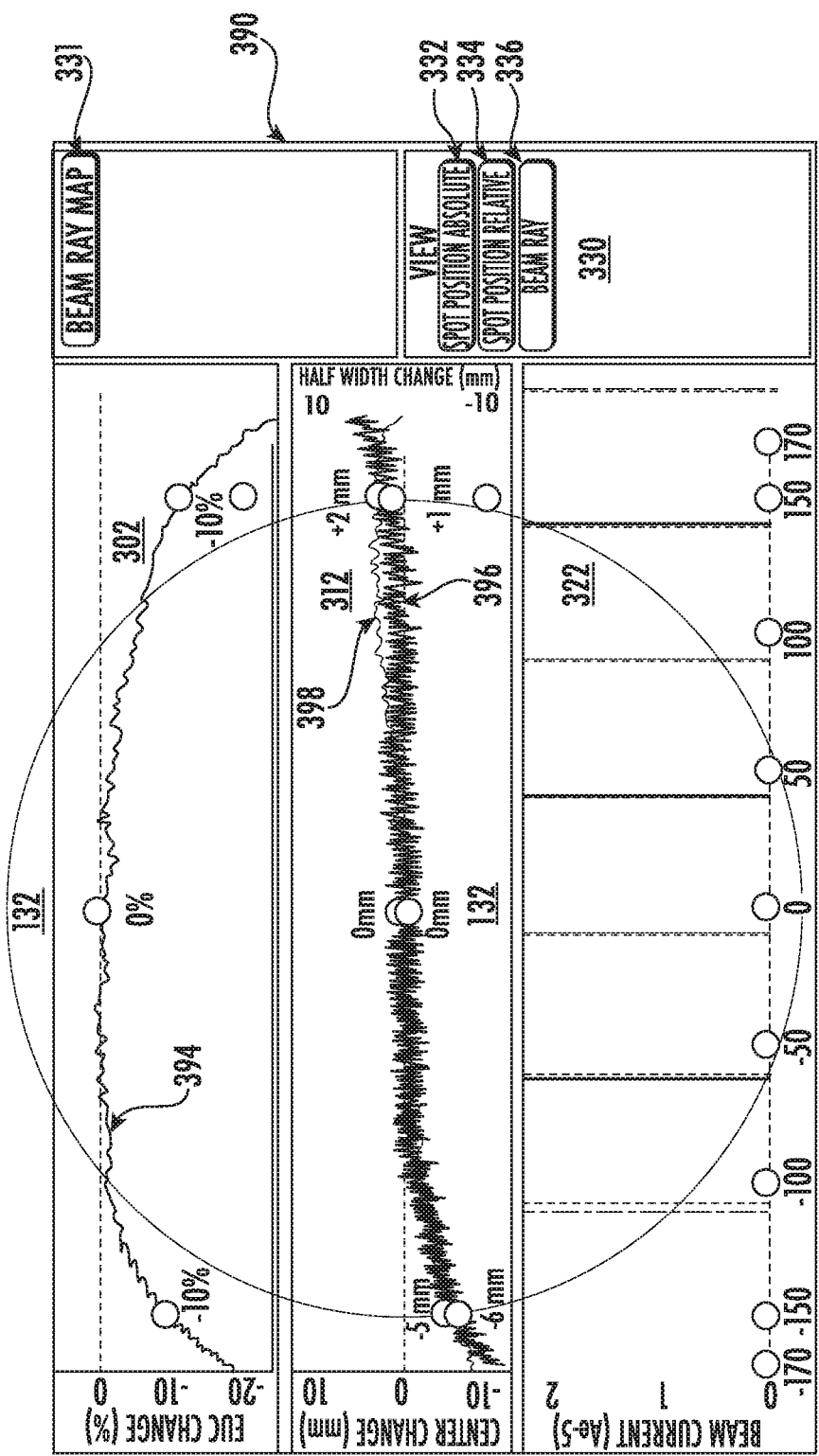

Continuing with the example of FIGS. 6 and 7, FIG. 8 shows a user interface arrangement 390, showing the results of measurement of a scanned 5 kV boron spot beam after correction of the value of SCC. In this example, the EUC curve 394 may be similar to the curve 374, discussed above. Similarly, the curve 398, showing beam half-width, may be similar to the curve 376, discussed above. Notably, the slope of curve 396, the curve representing beam center difference, has been reduced almost to zero, meaning the beam rays of the scanned spot beam are deflected by the beam scanner onto the wafer plane at or close to the expected position. Said differently, the adjusted SCC, when applied to a beam scanner straightens out the beam rays of the scanned spot beam to remove the convergence shown in FIG. 6. In field 322, the position of beam centers of scanned spot beams is also shown to closely match the targeted, ideal beam position.

Figure 9:
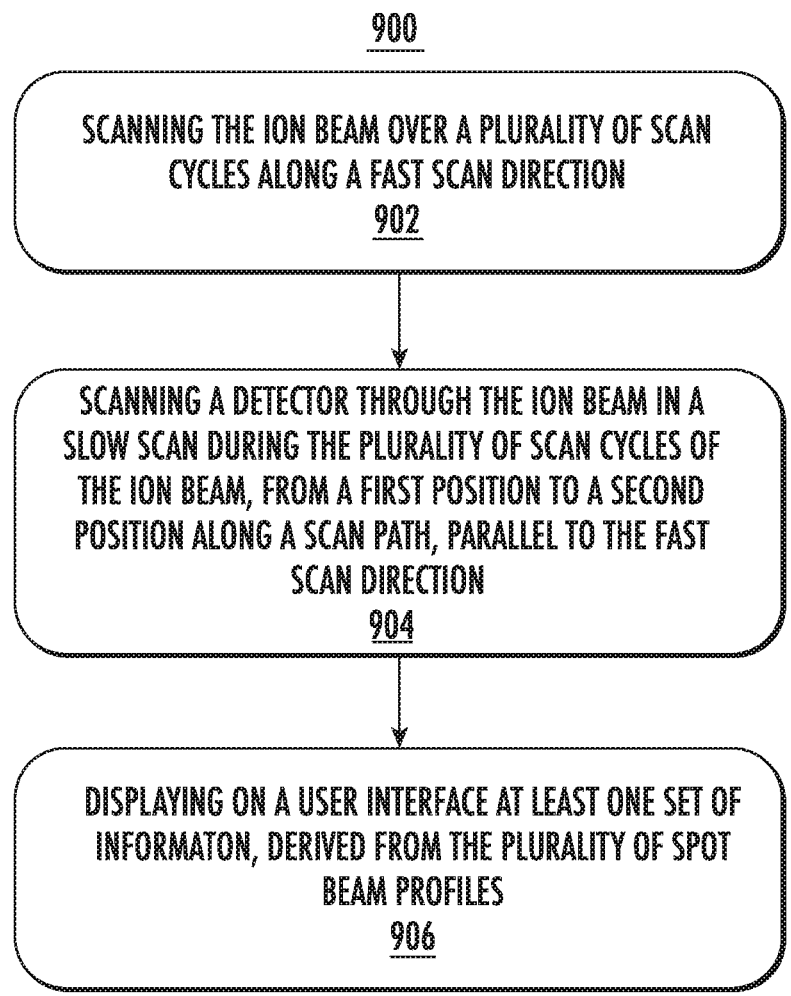
FIG. 9 depicts an exemplary process flow.

Turning now to FIG. 9, there is shown a process flow 900, according to some embodiments of the disclosure. At block 902, the operation is performed of scanning the ion beam over a plurality of scan cycles along a fast scan direction.

At block 904, the operation is performed of scanning a detector through the ion beam in a slow scan during the plurality of scan cycles of the ion beam, from a first position to a second position along a scan path, parallel to the fast scan direction. As a result of the scanning of the detector, a series of spot beam profiles are generated, where a spot beam profile corresponds to a beam profile of the ion beam at a given location of the detector along the scan path.

At block 906, the operation is performed of displaying on a user interface at least one set of information, derived from the plurality of spot beam profiles. In various embodiments, a set of information may include a display of a targeted plurality of scan cycles collected from the plurality of scan cycles of the ion beam.

In sum, the apparatus and techniques of the present embodiments provide novel visualizations of how scanned spot beam characteristics changes as a spot beam is scanned across the wafer plane. This information is increasingly useful in the case of lower energy spot beams where the low energy spot beams can show significant changes in beam shape and deviations from expected position in a wafer plane position during scanning of the lower energy spot beam. By being able to visualize the changes in shape and position of the scanned spot beam, an operator can readily perform adjustments to focusing and steering elements upstream of a detector, to minimize these changes and improve overall uniformity, repeatability and tune time.

Advantages provided by the present embodiments are multifold. As a first advantage, the present embodiments afford rapid determination if a scalar calibration constant of a beam scanner is incorrect, allowing software or other equipment to make more accurate adjustments to a scanned beam. Particularly, any non-linear convergence or divergence in the SCC, such as at edges of substrates may be highlighted. Another advantage is the ability to reveal how components in a beamline may locally affect an ion beam. For example, a flood gun or similar component may cause local perturbations in a scanned ion beam where the local perturbations are visualized in user interface as disclosed herein, where such perturbations are not measurable by known beam profile measurement approaches. A further advantage is the increased facilitation of beam recipe development, since the effect on scanned spot beam characteristics of changing a given parameter may be rapidly assessed within a matter of minutes or less.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus for monitoring of an ion beam, comprising:
   a processor; and
   a memory unit coupled to the processor, including a display routine, the display routine operative on the processor to manage monitoring of the ion beam, the display routine comprising:
   a measurement processor to:
   receive a plurality of spot beam profiles of the ion beam, the spot beam profiles collected during a fast scan of the ion beam and a slow mechanical scan of a detector, conducted simultaneously with the fast scan, the fast scan comprising a plurality of scan cycles having a frequency of 10 Hz or greater along a fast scan direction, and the slow mechanical scan being performed in a direction parallel to the fast scan direction;
   receive position information from the detector, the position information comprising a plurality of detector locations, collected at a plurality of instances, wherein the plurality of spot beam profiles correspond to the plurality of detector locations;
   determine a spot beam center position at the plurality of detector locations;
   determine a difference between the spot beam center position and an ideal center position at a plurality of detector locations; and
   send a signal to display the difference as a function of detector location.

2. The apparatus of claim 1, the measurement processor, responsive to user input, to send a signal to display at least some of the plurality of the spot beam profiles.

3. The apparatus of claim 2, the measurement processor to send a signal to display the at least some of the plurality of the spot beam profiles, in a superimposed fashion.

4. The apparatus of claim 1, the measurement processor to generate a plurality of average spot beam profiles from the plurality of spot beam profiles, wherein an average spot beam profile comprises an average of at least three spot beam profiles, recorded in succession.

5. An apparatus for monitoring of an ion beam, comprising:
   a processor; and
   a memory unit coupled to the processor, including a display routine, the display routine operative on the processor to manage monitoring of the ion beam, the display routine comprising:
   a measurement processor to:
   receive a plurality of spot beam profiles of the ion beam, the spot beam profiles collected during a fast scan of the ion beam and a slow mechanical scan of a detector, conducted simultaneously with the fast scan, the fast scan comprising a plurality of scan cycles having a frequency of 10 Hz or greater along a fast scan direction, and the slow mechanical scan being performed in a direction parallel to the fast scan direction;
   determine a spot beam half-width for the plurality of spot beam profiles; and
   responsive to user input, send a signal to display a difference between the spot beam half-width and an ideal beam half-width of at least some spot beam profiles of the plurality of the spot beam profiles.

6. The apparatus of claim 5, the measurement processor, responsive to user input, to send a signal to display at least some of the plurality of the spot beam profiles.

7. The apparatus of claim 6, the measurement processor to send a signal to display the at least some of the plurality of the spot beam profiles, in a superimposed fashion.

8. The apparatus of claim 5, the measurement processor to generate a plurality of average spot beam profiles from the plurality of spot beam profiles, wherein an average spot beam profile comprises an average of at least three spot beam profiles, recorded in succession.

* * * * *